(12) United States Patent
Modi et al.

(10) Patent No.: US 7,719,109 B2
(45) Date of Patent: May 18, 2010

(54) EMBEDDED CAPACITORS FOR REDUCING PACKAGE CRACKING

(75) Inventors: Mitul Modi, Phoenix, AZ (US); Sudarshan V. Rangaraj, Chandler, AZ (US); Shankar Ganapathysubramanian, Phoenix, AZ (US); Richard J. Harries, Chandler, AZ (US); Sankara J. Subramanian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 273 days.

(21) Appl. No.: 11/541,233

(22) Filed: Sep. 29, 2006

(65) Prior Publication Data

US 2008/0096310 A1 Apr. 24, 2008

(51) Int. Cl.
*H01L 23/10* (2006.01)
*H01L 23/34* (2006.01)

(52) U.S. Cl. ............... 257/706; 257/702; 257/703; 257/712; 257/E23.08

(58) Field of Classification Search ......... 257/668, 257/702, 703, 706, 712, 720; 174/255, 548; 361/704, 719, 720, 748
See application file for complete search history.

(56) References Cited

U.S. PATENT DOCUMENTS

| 5,900,675 A * | 5/1999 | Appelt et al. ............ 257/778 |
| 6,281,592 B1 * | 8/2001 | Murayama ............... 257/796 |
| 7,253,504 B1 * | 8/2007 | Zhai et al. ............... 257/668 |
| 2006/0175083 A1 * | 8/2006 | Muramatsu et al. ...... 174/260 |

OTHER PUBLICATIONS

Rectangle. (2007). In The American Heritage® Dictionary of the English Language. Boston, MA: Houghton Mifflin. Retrieved Jul. 3, 2009, from http://www.credoreference.com/entry/hmdictenglang/rectangle.*

* cited by examiner

*Primary Examiner*—Sue Purvis
*Assistant Examiner*—Leslie Pilar Cruz
(74) *Attorney, Agent, or Firm*—Blakely, Sokoloff, Taylor & Zafman LLP

(57) ABSTRACT

A linear coefficient of thermal expansion (CTE) mismatch between two materials, such as between a microelectronic die and a mounting substrate, may induce stress at the interface of the materials. The temperature changes present during the process of attaching a die to a mounting substrate can cause cracking and failure in the electrical connections used to connect the die and mounting substrate. A material with a CTE approximately matching the die CTE is introduced in the mounting substrate to reduce the stress and cracking at the electrical connections between the die and mounting substrate. Additionally, this material may comprise thin film capacitors useful for decoupling power supplies.

12 Claims, 8 Drawing Sheets

EMBEDDED CAPACITORS FOR REDUCING PACKAGE CRACKING

FIELD OF INVENTION

The invention relates to the field of microelectronics, and more particularly to the packaging of microelectronics.

PRIOR AND RELATED ART

To make a system with an integrated circuit, such as a microprocessor, a microelectronic die is often bonded to a mounting substrate. The mounting substrate may be coupled to another component such as a printed circuit board. Electrical contacts on the die may be connected to corresponding contacts on the side of the mounting substrate facing the die.

As increasingly complex microelectronic dies consume more power, the need for decoupling capacitors near the die also increases. Accordingly, decoupling capacitors are often mounted close to the die on the same mounting substrate surface to which the die is attached. The number and size of surface mounted capacitors that can be placed near the die is limited by the footprint of the capacitors and space available on the mounting substrate.

Materials used to construct the dies and mounting substrates have a wide range of thermal expansion properties. The linear coefficient of thermal expansion (CTE) relates a change in a material's linear dimension to a corresponding change in temperature. The CTE of a material is given in parts per million per degree of temperature change (ppm/K°). Often, integrated circuits (IC) are fabricated on silicon which has a CTE of about 3 ppm/K°. Organic mounting substrates commonly comprise a fiber reinforced glass core having a CTE between about 15-20 ppm/K°. Organic mounting substrates are often used because of their physical strength, good electrical qualities, and relatively low cost. The CTE mismatch between two or more materials, such as between a microelectronic die and a mounting substrate, induces stress at the interface of the materials during manufacture and operation.

Controlled Collapsible Chip Connection (C4) is one popular method of electrically and mechanically attaching a die to a mounting substrate. Conductive solder bumps (C4 joints) are placed on contacts on the die at portions corresponding to contacts on the mounting substrate. The surface of the die having C4 joints is then placed onto the mounting substrate and attached using a re-flow process. During the re-flow process, the temperature is raised to the melting point of the solder bumps. As long as the temperature remains above the melting point of the solder bumps, both the die and mounting substrate are free to expand independently.

However, as the temperature drops below the melting point of the solder relative motion between the die and mounting substrate is prevented and they are forced to contract together. The mounting substrate, due to its larger CTE, contracts more than the die. Consequently, the C4 joints are stressed and often crack. Stresses on the C4 joints tend to be greatest near the edges of the die where the relative movement between the die and the mounting substrate is greatest. This problem is exacerbated by large dies and thick, stiff substrates, such as those used in high end servers.

Presently, the problem of C4 joint cracking due to CTE mismatch is addressed by using entirely ceramic mounting substrates that have CTEs more closely matching the CTE of silicon. This solution is not ideal because of the high cost of ceramic substrates. Alternatively, sacrificial C4 joints may be introduced around the periphery of the die. This alternative, however, reduces the total amount of power and input/output (I/O) available under the die. Likewise, increasing the pitch between C4 joints reduces the amount of power and I/O available to a chip.

DETAILED DESCRIPTION

In various embodiments, an apparatus and method relating to the formation and structure of a mounting substrate for a microelectronic die are described. However, one skilled in the relevant art will recognize that the various embodiments may be practiced without one or more of the specific details. Well-known structures, materials, or operations are not described in detail to avoid unnecessarily obscuring the present invention. Further, various embodiments shown in the figures are illustrative representations and are not necessarily drawn to scale.

Figure 1:
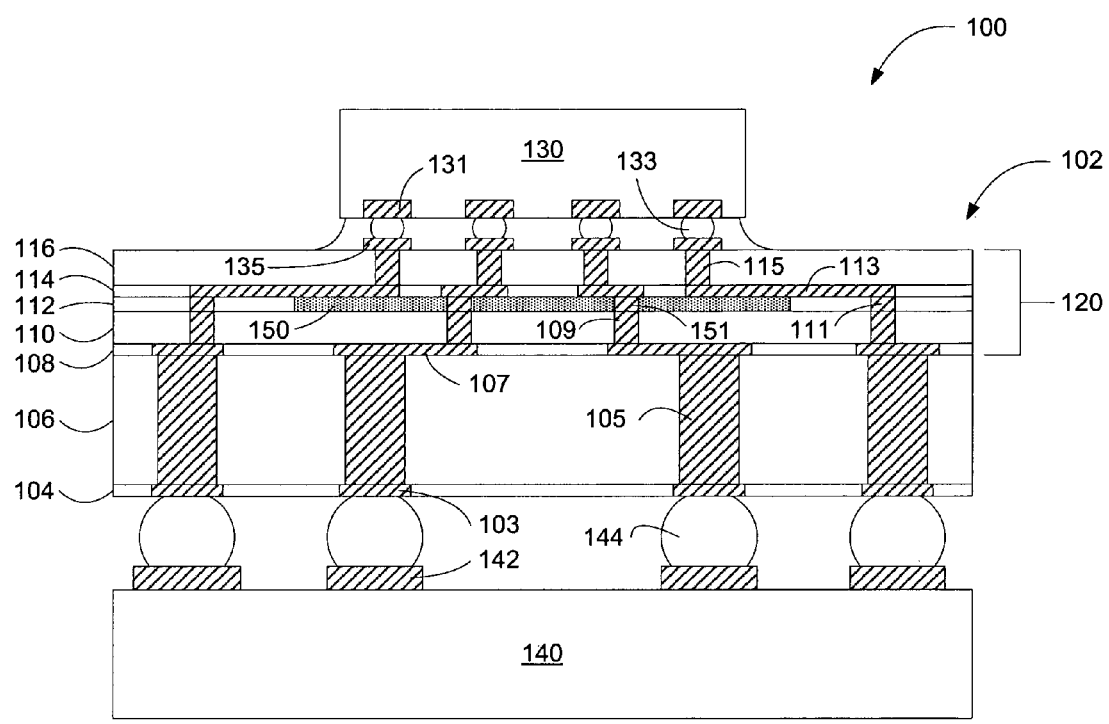
FIG. 1 is an elevational, cross section view of a mounting substrate including an embedded material and, a microelectronic die attached to the mounting substrate, with the mounting substrate attached to a printed circuit board.

FIG. 1 illustrates a device 100 including a microelectronic die 130, a mounting substrate 102 connected to the die 130, and a printed circuit board 140 connected to the mounting substrate 102. The die 130 comprises a silicon substrate which has a CTE of approximately 3 ppm/K°. Alternatively, the die 130 may be formed of other materials such as SiGe. The die 130 includes electrical contacts 131 which have a "pitch," the distance between them.

The mounting substrate 102 may comprise a fiber reinforced glass core 106 on which other layers or structures are fabricated. One or more build up layers may be formed on either or both of the top and bottom surfaces of the core 106. In FIG. 1, a single build up layer 104 is disposed on the bottom surface of the core 106 and various build up layers 120 are disposed over the top surface of the core 106. Layer 104 comprises contacts 103 for connection to the contacts 142 of the printed circuit board 140.

Although the core 106 may also be formed of other materials such as ceramic, fiber reinforced glass is popular because of its physical strength, good electrical qualities, and relatively low cost. However, organic mounting substrates comprised of fiber reinforced glass cores have relatively high CTEs of between about 15-20 ppm/K°. The core 106 has vias 105 throughout.

The mounting substrate 102 further comprises electrical contacts 135 having a pitch substantially the same as the pitch of the die contacts 131, such that the contacts 131, 135 match up for a simple connection. Contacts 131 of the die 130 are electrically and mechanically connected to contacts 135 of the mounting substrate 102 by C4 joints 133 comprising eutectic solder balls. Other materials including lead tin solder, solder paste, epoxies and the like may be used to connect the contacts 131, 135. The package described above can also be placed in a socket such as in Land Grid Array or Pin Grid Array packages.

Figure 4:
FIG. 4 is a scanning electron microscope (SEM) image showing C4 joint cracking.

In the embodiment of FIG. 1 where the die 130 is comprised of silicon and the core 106 of fiber reinforced glass, the CTE mismatch can lead to cracking and failure in the C4 joints 133, particularly during the temperature swings accompanying die attach and assembly. In the SEM image of FIG. 4, cracking of a C4 joint resulting from CTE mismatch is illustrated. Note the dark regions near the top of the joint.

Returning to FIG. 1, the build up layers 120 comprise alternating insulating and conducting layers as is well known in the art. Specifically, layers 108 and 114 are conducting layers containing traces 107 and 113, respectively. Layers 110 and 116 are insulating layers containing vias 109 and 115, respectively. An intermediate insulating layer 112, comprising an embedded material 150, is disposed between insulating layer 110 and conducting layer 114.

The embedded material 150 may be chosen with a CTE between the CTE of the core 106 and the CTE of the die 130. Preferably, the CTE of the embedded material 150 is more equal to the CTE of the die 130. Where the die 130 is comprised of silicon with a CTE of about 3 ppm/K°, the CTE of the embedded material 150 is preferably between about 3-6 ppm/K° for one embodiment, that is approximately matching the CTE of the die. The relatively low CTE of the embedded material 150 reduces the undesirable local CTE mismatch between the die 130 and mounting substrate 102. Accordingly, the embedded material 150 absorbs or cancels out some or all of the stress resulting from temperature changes that would otherwise exist at the C4 joints 133. Thus, cracking and failure of C4 joints 133 due to CTE mismatch is reduced or eliminated. Compared with structures that do not utilize a stress reducing material, the embedded material 150 may significantly reduce the stress on the C4 joints. The embedded material 150 shown in FIG. 1 has vias 151 aligned with vias 109 for electrical connection between traces above and below such as traces 107 and 113. Likewise, elsewhere in the intermediate layer 112 vias 111 align with vias 109 for electrical connection between traces 107 and 113. Portions of intermediate layer 112 without the embedded material 150 comprise an insulating dielectric. In some embodiments, the embedded material will not have vias.

The placement location of the embedded material influences how effective the embedded material is at preventing C4 joint cracking. Both the selection of the layer in which the embedded material is located, and the lateral location within the selected layer may be important. Moreover, the embedded material may be introduced into more than one layer. Some mounting substrates have more than one core layer and the embedded material may be placed between core layers. Thus, the embedded material may be placed in one or more build up layers above or below the core layer and/or within the core layer itself.

FIGS. 5a through 5j illustrate mounting substrates similar to the mounting substrate 102 with ten different placement locations for the embedded material. The simplified illustrations of FIGS. 5a-j are based on two dimensional (2D) plane strain finite element models that were used to examine the benefit of the embedded material on C4 joint cracking during assembly. In each of FIGS. 5a through 5j a die 530 is attached to a mounting substrate 502 by solder balls 533. The mounting substrate 502 is comprised of a core layer 506, conducting layers 504, 508, 514, insulating layers 510, 516, and an intermediate layer 512 which comprises an embedded material 550.

Figure 5A:
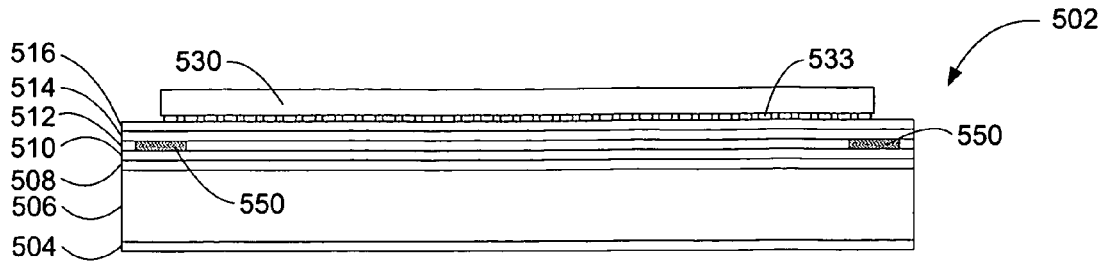
FIG. 5a illustrates one embodiment where the embedded material is disposed about the periphery of the die.

FIG. 5a shows an embodiment where the embedded material 550 is located between the buildup layers 510, 514 and follows the contour of the die 530. Thus, the embedded material 550 comprises only a portion of the intermediate layer 512 and resembles a hollow rectangle if viewed from above. Recall that the C4 joints nearest the die edge are most susceptible to cracking.

Figure 5B:
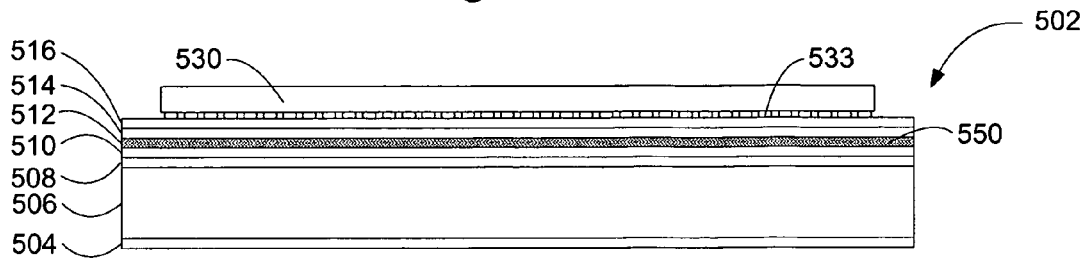
FIG. 5b illustrates another embodiment where the embedded material comprises an entire build up layer.
Figure 5C:
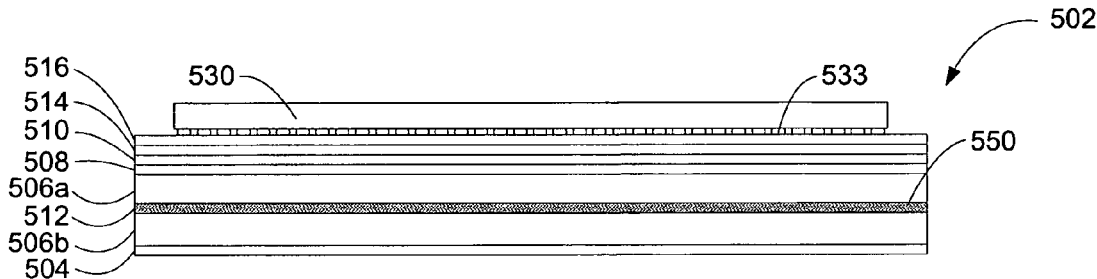
FIG. 5c illustrates still another embodiment where the embedded material is located within a mounting substrate core.
Figure 5D:
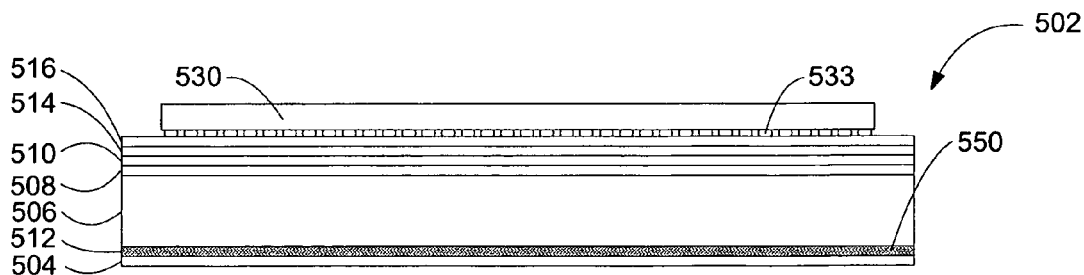
FIG. 5d illustrates yet another embodiment with the embedded material in a build up layer on the surface of the mounting substrate opposite from the die.

In each of FIGS. 5b through 5d the embedded material 550 comprises substantially the entire intermediate layer 512. FIG. 5b shows an embodiment where the embedded material 550 is disposed between buildup layers 510, 514, relatively close to the die 530. FIG. 5c shows an embodiment where the embedded material 550 is located between two core layers 506a, 506b. In this embodiment the intermediate layer 512 is located further from the die than in FIG. 5b. FIG. 5d shows an embodiment where the embedded material 550 is disposed on the surface of the core layer 506 not containing the die 530. In this embodiment the intermediate layer 512 is relatively far away from the die 530.

Figure 5E:
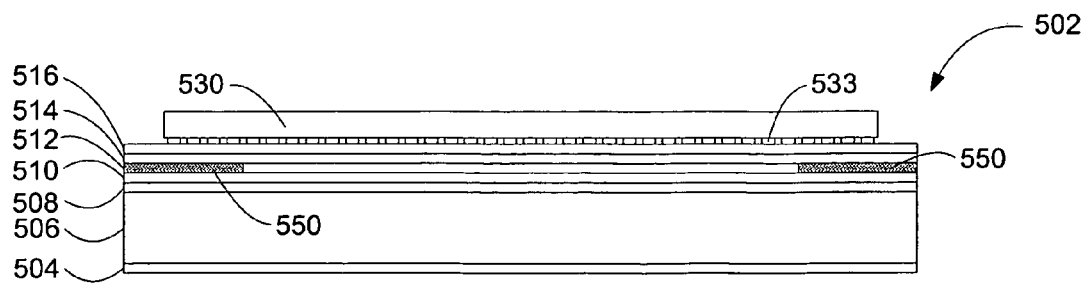
FIG. 5e illustrates an additional embodiment where the embedded material extends inward from the mounting substrate periphery.
Figure 5F:
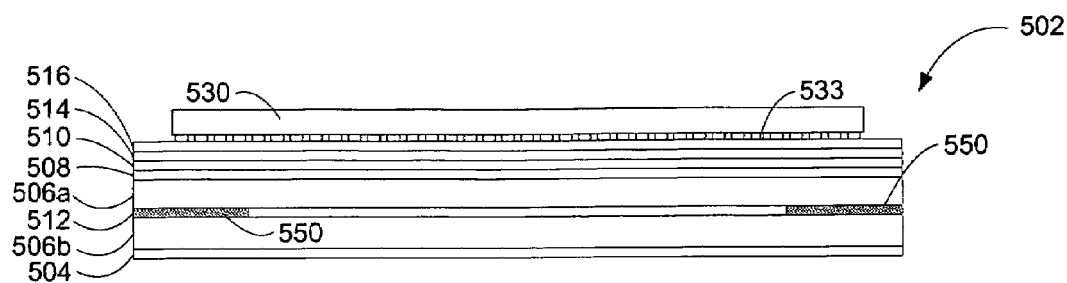
FIG. 5f illustrates another embodiment having the embedded material located within the core layers of the mounting substrate.
Figure 5G:
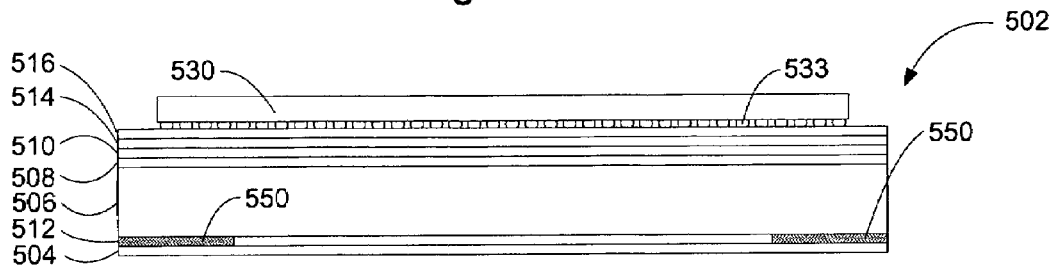
FIG. 5g illustrates yet another embodiment with the embedded material generally in the shape of a hollow rectangle.

In each of FIGS. 5e through 5g the embedded material 550 extends from the outer edges of the mounting substrate 502 inward, encompassing a region underneath the periphery of the die 530. FIG. 5e shows an embodiment where the embedded material 550 is disposed relatively close to the die 530 between buildup layer 510, 514. In FIG. 5f the embedded material 550 is located further from the die 530 between core layers 506a, 506b. In FIG. 5g, the embedded material 550 is disposed on the surface of the core layer 506 not containing the die 530. In this embodiment the intermediate layer 512 is relatively distant from the die 530.

Figure 5H:
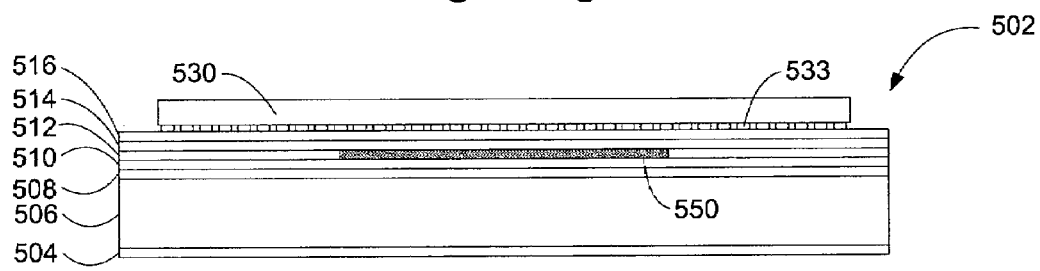
FIG. 5h illustrates an additonal embodiment showing the embedded material centrally located beneath the die.
Figure 5I:
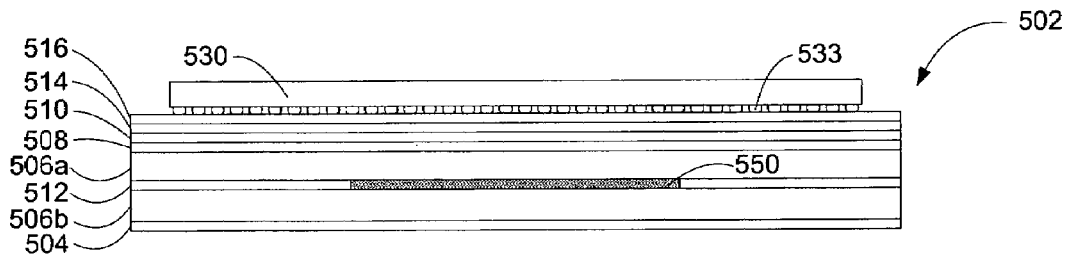
FIG. 5i illustrates an embodiment where the embedded material is beneath the die between two core layers.
Figure 5J:
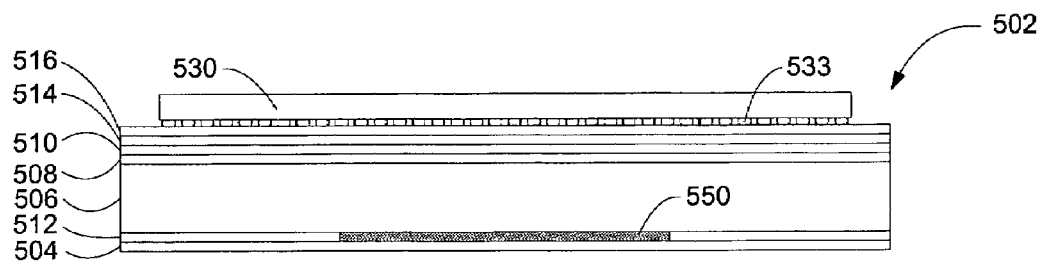
FIG. 5j illustrates a last embodiment having the embedded material located entirely beneath the die on the side of the mounting substrate not attached to the die.

In each of FIGS. 5h through 5j the embedded material 550 is centrally located in a region beneath the die 530 that may approach but does not extend beyond the periphery of the die 530. In FIG. 5h the embedded material 550 is disposed relatively close to the die 530 between buildup layers 510, 514. In FIG. 5i the embedded material 550 is located further from the die 530 between core layers 506a, 506b. In FIG. 5j, the intermediate layer 512 is disposed on the surface of the core layer 506 not containing the die 530. In this embodiment the intermediate layer 512 is relatively distant from the die 530.

Although the embodiments of FIG. 5 show the embedded material 550 as a continuous unitary shape, the embedded material 550 may be comprised of two or more separate pieces.

Figure 6A:
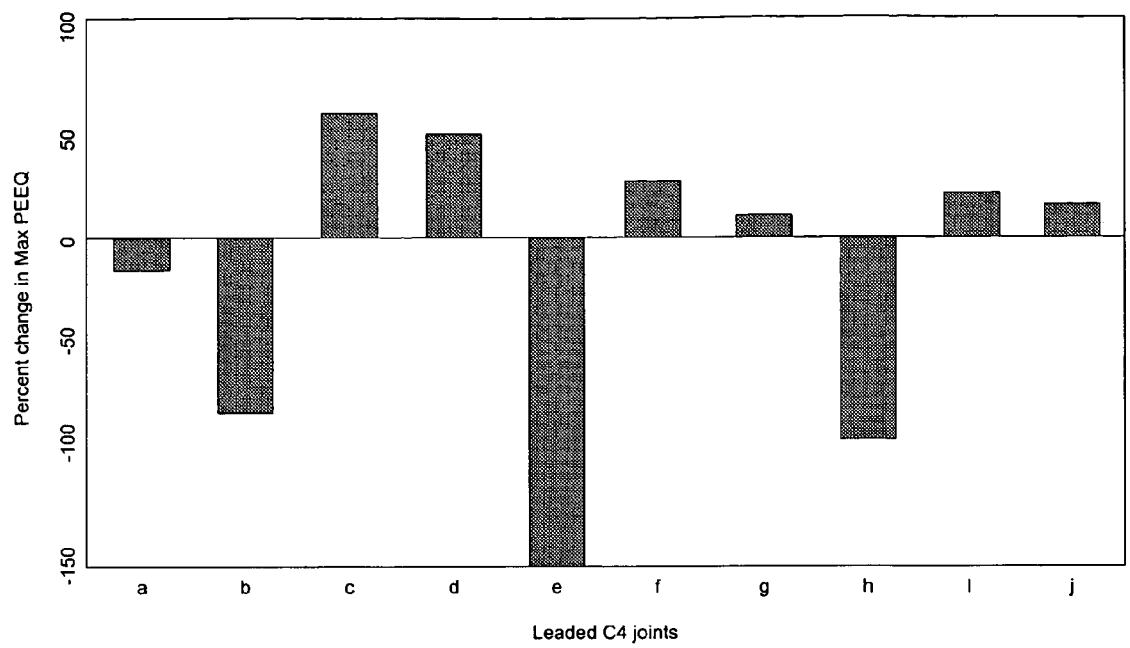
FIG. 6a shows simulation results for leaded C4 joints based on ten models corresponding to the ten embodiments of FIGS. 5a-j.
Figure 6B:
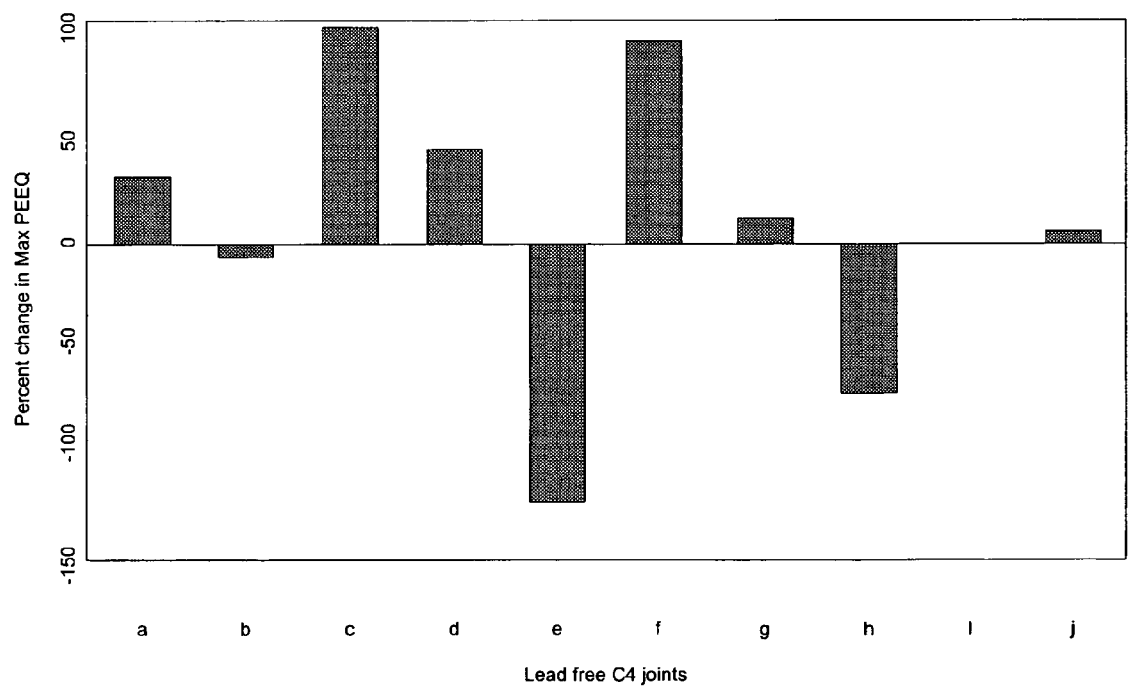
FIG. 6b shows simulation results for lead-free C4 joints based on ten models corresponding to the ten embodiments of FIGS. 5a-j.

Two sets of simulations were performed on each of the models corresponding to the ten placement locations in FIGS. 5a through 5j. FIG. 6 shows the simulation results, namely, the percent change in the Max Plastic Equivalent Strain (PEEQ) from the baseline PEEQ value for each of the placements. PEEQ is a metric that trends with C4 joint cracking. Positive PEEQ Percent changes correlate to reduced C4 joint cracking where greater positive changes indicate greater benefits. FIG. 6a corresponds to leaded C4 joints of one process and FIG. 6b corresponds to lead free C4 joints of another process. The results indicate that the placement locations of FIG. 5c, FIG. 5d, and FIG. 5f are more beneficial for reducing the risk of C4 joint cracking during assembly of both leaded and lead free C4 joints.

Returning again to FIG. 1, the embedded material 150 may comprise barium titanate (BaTiO3) having a CTE of about 6 ppm/K° and modulus of about 120 GPa, barium strontium titanate (BST) having a CTE of about 6 ppm/K° and modulus of about 200 GPa, gallium arsenide (GaAs) having a CTE of about 5 ppm/K° and modulus of about 75 GPa, silicon having a CTE of about 3 ppm/K° and modulus of about 130 GPa, and/or aluminum film having a CTE of about 6 ppm/K° and modulus of about 350 GPa.

The modulus is a measure of the stiffness of a material and indicates how much a material will contract under compression before buckling (or stretch under tension before fracturing).

In some embodiments, the embedded material 150 is between about 15 and 45 microns thick. The embedded material 150 may be comprised of a unitary preformed material or, alternatively, the embedded material may be comprised of two or more separate pieces. In one embodiment, the embedded material comprises ceramic capacitors or BST capacitors (not shown). Using thin film capacitors having a CTE approximately equal or similar to that of the die 130 is desirable because, in addition to reducing C4 joint cracking, an electrical function is served as well. Specifically, more decoupling capacitance may be placed closer to the power and I/O pins on a microelectronic die and/or capacitors need not be placed on the surface of the mounting substrate adjacent the die. Additionally, other passive devices including resistors and inductors may comprise the embedded material.

The mounting substrate 102 is attached to the circuit board 140 using solder balls 144. Other methods known in the art may be used to attach the mounting substrate 102 to the printed circuit board 140. Several examples include land grid array (LGA), pin grid array (PGA), and ball grid array (BGA) technologies.

FIGS. 2a through 2d are cross sectional side views that illustrate how the mounting substrate 102 of FIG. 1 may be fabricated according to one embodiment.

Figure 2A:
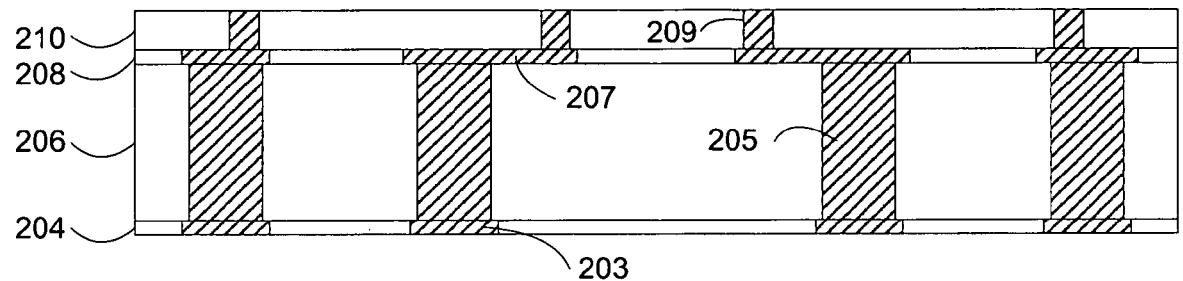
FIG. 2a is an elevational, cross section view of a partially constructed mounting substrate.

FIG. 2a illustrates a partially completed mounting substrate fabricated according to methods well known in the art. The mounting substrate comprises a core layer 206 with vias 205, a conducting layer 204 with contacts 203, a conducting layer 208 with traces 207, and an insulating layer 210 with vias 209. In some embodiments, the core layer 106 may comprise a material with a CTE significantly higher than that of the die 130 to which the mounting substrate 102 will be attached.

Figure 2B:
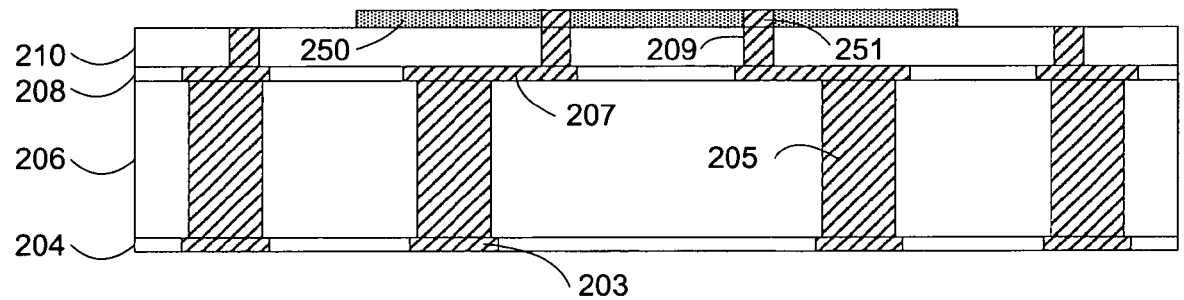
FIG. 2b is an elevational, cross section view of the mounting substrate including an embedded material.

FIG. 2b illustrates an embedded material 250 placed on insulating layer 210. The embedded material 250 is, so called, because once the build up process is complete the material is substantially enclosed within the traditional insulating and conducting layers which comprise the build up layers 120 of FIG. 1. In one embodiment, the embedded material 250 comprises a preformed insulating substance including preformed vias 251 and may be aligned and dropped in place such that vias 251 contact the underlying vias 209.

Figure 2C:
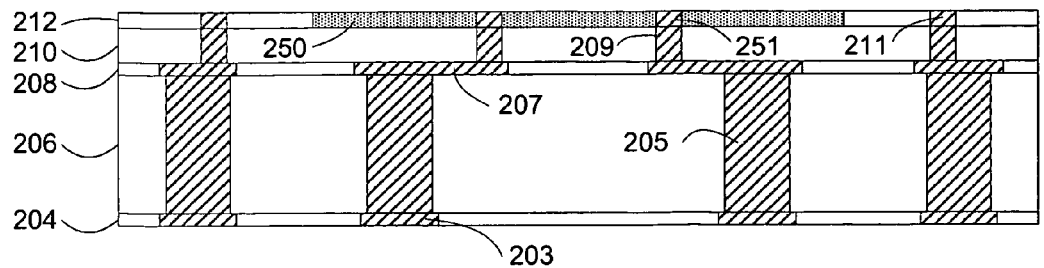
FIG. 2c is an elevational, cross section view of the mounting substrate showing planarization of the layer with the embedded material.

FIG. 2c illustrates that intermediate layer 212 is completed by a planarization process to create a substantially flat surface for further processing. Additional vias 211 may be formed in intermediate layer 212 where needed to connect to underlying vias 209.

Figure 2D:
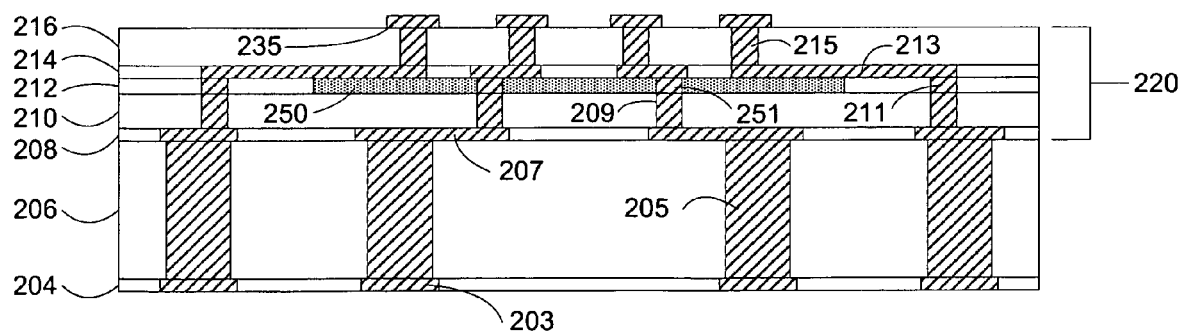
FIG. 2d is an elevational, cross section view showing additional build up layers formed over the embedded material of FIG. 2c.

FIG. 2d illustrates a conducting layer 214 with traces 213 formed on intermediate layer 212 and insulating layer 216 with vias 215 connecting to traces 213 formed on the conducting layer 214. Electrical contacts 235 are formed over vias 215. These layers may be fabricated by conventional methods well known in the art.

Although FIGS. 2a through 2d have shown one process for forming the mounting substrate 102, those of skill in the art will recognize that other processes may also be used.

The manner of forming the mounting substrate 102 shown in FIGS. 2a through 2d is advantageous because reduced C4 joint cracking and better die attach yield may be achieved without costly changes to the fabrication process of the microelectronic die 130. Additionally, the formation process described is compatible with current standard processes used to form conducting and insulating build up layers as well as standard die attach processes. Further, the process of FIG. 2 allows for the continued use of relatively low cost organic mounting substrates comprised of fiber reinforced glass cores for attachment to large dies, such as those common in high end servers.

Figure 3:
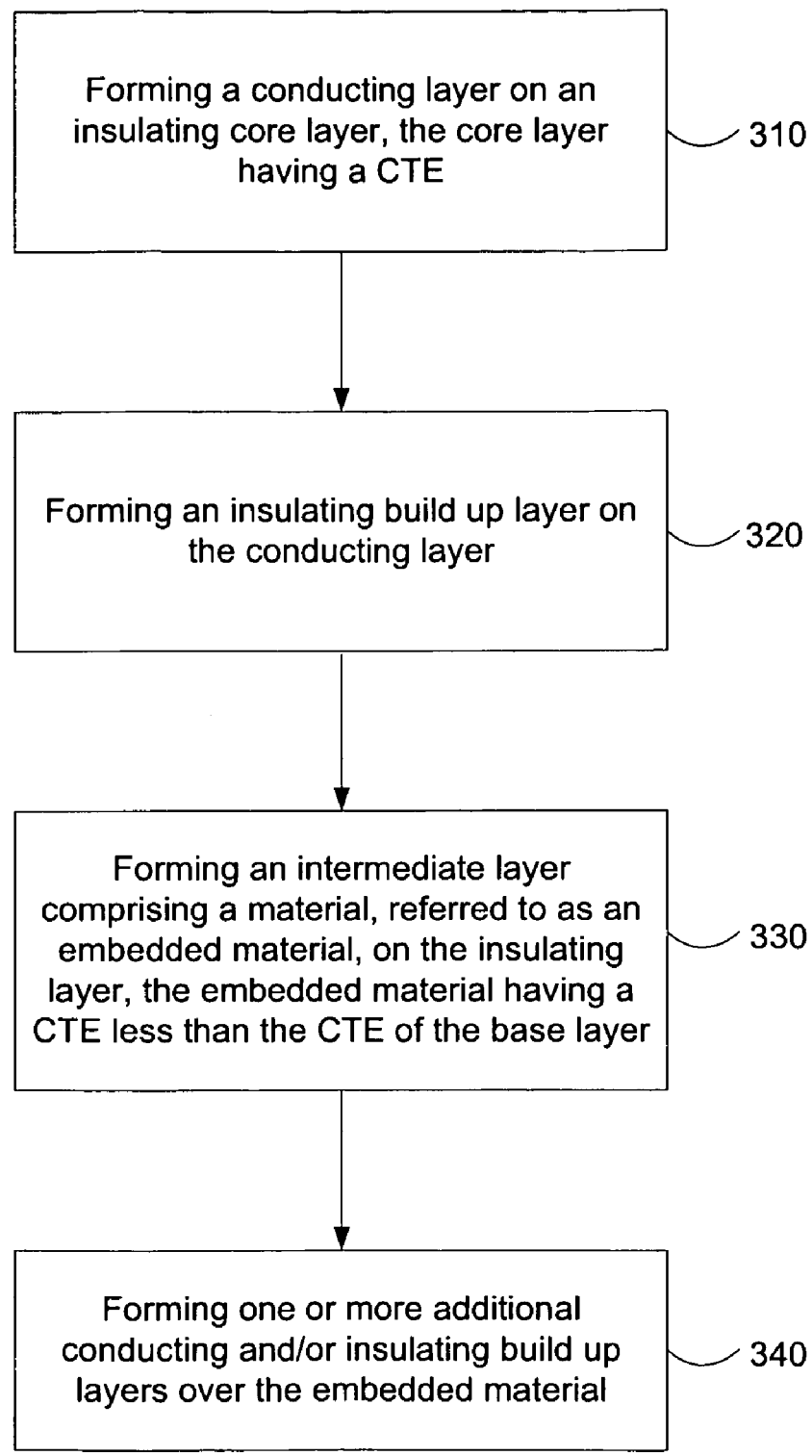
FIG. 3 is a flow diagram illustrating one embodiment of a process for fabricating the mounting substrate of FIG. 2.

FIG. 3 depicts a flow chart illustrating the steps of fabricating the substrate 102 according to one embodiment. At step 310, a conducting build up layer is formed over an insulating core layer. An insulating build up layer is next formed over the conducting layer (step 320). Then, at step 330, an intermediate layer comprising a material, referred to as an embedded material, is formed on the insulating layer. The embedded material may be a preformed material with or without vias that is simply dropped in place. An optional planarizing operation may be performed on the intermediate layer if necessary. The embedded material has a CTE less than the CTE of the core layer. At step 340, one or more additional conducting and/or insulating build up layers are formed over the embedded material.

The foregoing description of the embodiments is presented for purposes of illustration and is not intended to be exhaustive. Additional layers and/or structures may be included or omitted from the described embodiments. The processes described may be performed in a different order than the described embodiment and steps may be left out or added in additional embodiments.

We claim:

1. An apparatus comprising:
   a microelectronic die having a plane and having a coefficient of thermal expansion (CTE);
   a mounting substrate for receiving the die, the mounting substrate having a CTE nominally different than the CTE of the die, the mounting substrate including an embedded material having a plane and having a CTE approximately matching the CTE of the die such that the embedded material absorbs stress resulting from temperature changes, wherein the plane of the embedded material is approximately parallel with the plane of the microelectronic die, and wherein the embedded material is a hollow rectangle shape and is aligned with a periphery of the microelectronic die, and wherein the embedded material is comprised in a thin film capacitor having a plane approximately parallel with the plane of the microelectronic die.

2. The apparatus as in claim 1, wherein the die comprises silicon with a CTE of about 3 ppm/K°, the substrate comprises a fiber reinforced glass core with a CTE of between about 15-20 ppm/K°, and the embedded material has a CTE between about 3 ppm/K° and about 6 ppm/K°.

3. The apparatus as in claim 1, wherein the embedded material comprises a material selected from the group consisting of silicon, ceramic, barium titanate, barium strontium titanate, gallium arsenide, and alumina.

4. The apparatus as in claim 1, wherein the embedded material is between about 15 microns and 45 microns thick.

5. The apparatus as in claim 1, wherein the capacitor is a thin film ceramic capacitor or a thin film barium strontium titanate (BST) capacitor.

6. The apparatus as in claim 1, wherein the embedded material extends from the outer edges of the mounting substrate inward, encompassing a region underneath the microelectronic die.

7. An apparatus comprising:
   a microelectronic die having a plane and having a coefficient of thermal expansion (CTE);
   a mounting substrate for receiving the die, the mounting substrate having a CTE nominally different than the CTE of the die, the mounting substrate including an embedded material having a plane and having a CTE approximately matching the CTE of the die such that the embedded material absorbs stress resulting from temperature changes, wherein the embedded material is comprised in a thin film capacitor having a plane approximately parallel with the plane of the microelectronic die, wherein the plane of the embedded material is approximately parallel with the plane of the microelectronic die, and wherein the embedded material is a hollow rectangle shape, but not a hollow square shape, and is aligned with a periphery of the microelectronic die.

8. The apparatus as in claim 7, wherein the die comprises silicon with a CTE of about 3 ppm/K°, the substrate comprises a fiber reinforced glass core with a CTE of between about 15-20 ppm/K°, and the embedded material has a CTE between about 3 ppm/K° and about 6 ppm/K°.

9. The apparatus as in claim 7, wherein the embedded material comprises a material selected from the group consisting of silicon, ceramic, barium titanate, barium strontium titanate, gallium arsenide, and alumina.

10. The apparatus as in claim 7, wherein the embedded material is between about 15 microns and 45 microns thick.

11. The apparatus as in claim 7, wherein the capacitor is a thin film ceramic capacitor or a thin film barium strontium titanate (BST) capacitor.

12. The apparatus as in claim 7, wherein the embedded material extends from the outer edges of the mounting substrate inward, encompassing a region underneath the microelectronic die.

* * * * *